United States Patent [19]

Tsai

[11] Patent Number: 5,747,113
[45] Date of Patent: May 5, 1998

[54] METHOD OF CHEMICAL VAPOR DEPOSITION FOR PRODUCING LAYER VARIATION BY PLANETARY SUSCEPTOR ROTATION

[76] Inventor: Charles Su-Chang Tsai, 2653 S. Daytona Ave., Hacienda Hts, Calif. 91745

[21] Appl. No.: 688,256

[22] Filed: Jul. 29, 1996

[51] Int. Cl.$^6$ .................................................. C23C 16/00
[52] U.S. Cl. ............................ 427/255.5; 427/248.1; 118/730
[58] Field of Search ........................... 427/255.5, 248.1; 118/729, 730

[56] References Cited

U.S. PATENT DOCUMENTS

| | | | |
|---|---|---|---|
| 3,424,628 | 1/1969 | Winings et al. | 148/175 |
| 3,652,444 | 2/1972 | Lester et al. | 204/298 |
| 3,783,822 | 1/1974 | Wollam | 118/500 |
| 4,058,430 | 11/1977 | Suntola et al. | 156/611 |
| 4,098,223 | 7/1978 | Ertl et al. | 118/48 |
| 4,629,532 | 12/1986 | Yanase et al. | 156/612 |
| 4,705,700 | 11/1987 | Ikeda et al. | 437/231 |
| 4,851,256 | 7/1989 | Matsuyama et al. | 427/39 |
| 4,860,687 | 8/1989 | Frijlink | 118/500 |
| 4,961,399 | 10/1990 | Frijlink | 118/730 |
| 4,976,996 | 12/1990 | Monkowski et al. | 427/255.5 |
| 5,091,219 | 2/1992 | Monkowski et al. | 427/255.5 |
| 5,173,336 | 12/1992 | Kennedy | 427/248.1 |
| 5,455,069 | 10/1995 | Lee | 427/248.1 |
| 5,455,070 | 10/1995 | Anderson et al. | 427/248.1 |
| 5,468,299 | 11/1995 | Tsai | 118/730 |

FOREIGN PATENT DOCUMENTS 64-28370  1/1989  Japan.

OTHER PUBLICATIONS

P.M. Frijlink et al., "Layer uniformity in a multiwafer MOVPE reactor for III-V compounds," 1991, Journal of Crystal Growth vol. 107, pp. 166–174.

S.M. Sze, "Semiconductor Devices–Physics and Technology," 1985, pp. 321–329.

*Primary Examiner*—Roy V. King

[57] ABSTRACT

A chemical vapor deposition process for depositing at least one layer of material onto a plurality of substrates is disclosed, which comprises providing a reactor containing a planetary susceptor rotation means comprising a plurality of secondary susceptors for supporting said substrates, wherein said rotation means allows simultaneously at least two significantly different rotation rates for said secondary susceptors, and rotating said secondary susceptors simultaneouly at said two or more rotation rates during at least a portion of depositing said layer, wherein at least one of said two or more signicantly different rotation rates is not zero.

10 Claims, 2 Drawing Sheets

METHOD OF CHEMICAL VAPOR DEPOSITION FOR PRODUCING LAYER VARIATION BY PLANETARY SUSCEPTOR ROTATION

BACKGROUND

1. Field of Invention

The invention relates to the apparatus and methods for chemical vapor deposition (CVD). The invention further relates to the planetary form of susceptor rotation utilized in CVD.

2. Description of Prior Art

In prior-art apparatus and methods for CVD, the primary emphasis has been on producing uniform layers of coating, see for example U.S. Pat. No. 5,455,070 by Anderson, U.S. Pat. No. 5,455,069 by Lee, U.S. Pat. No. 5,173,336 by Kennedy, U.S. Pat. No. 4,976,996 by Monkowski, or U.S. Pat. No. 4,705,700 by Ikeda. For simultaneously coating multiple substrates in batch processing, the planetary form of susceptor rotation is utilized extensively to achieve the level of coating uniformity required over each substrate and from substrate to substrate within a batch, see for example U.S. Pat. No. 4,961,399 and 4,860,687 by Frijlink, or U.S. Pat. No. 3,424,628 by Winings. FIG. 1 illustrates one example of the prior-art planetary form of susceptor rotation, where a main susceptor 14 rotates at a rotation rate of $\omega_m$ in the indicated direction about main axis 20 and includes a number of secondary susceptors 114, 214, and 314. Secondary susceptors 114, 214, and 314 rotate at the same rotation rate $\omega_s$ in the indicated direction about secondary axes 120, 220, and 320 respectively. Excellent coating uniformity within a batch, including uniformity over each substrate and from substrate to substrate, has been achieved using this prior-art planetary form of susceptor rotation.

The prior-art apparatus and methods for CVD with planetary susceptor rotation as described are sufficient to achieve the required coating uniformity over each substrate in a batch once the process for a specific coating is developed for production. However, during the process development for a specific coating, applying the prior-art apparatus and methods results in wasted source materials and unnecessary development time. The prior-art apparatus for CVD with planetary susceptor rotation consumes the same amount of source materials whether one test substrate is being coated for process development or multiple substrates are being coated for production. Multiple iterations of process corrections are required to achieve the proper layer thicknesses and/or compositions during the development of a specific coating process. Each additional iteration requires a separate batch of substrates to be coated and further increases the development time.

OBJECTS AND ADVANTAGES

It is accordingly an object of the invention to eliminate the above disadvantages of the prior-art apparatus and methods for CVD with planetary susceptor rotation.

The invention would allow, for production, the required coating uniformity over each substrate in a batch. During the process development for a specific coating, the invention would also minimize the development time and the consumption of source materials. The invention would allow, in a single batch, multiple iterations of process corrections required to achieve the proper layer thicknesses and/or compositions for a specific coating process.

Other objects of the invention are to provide versatile CVD apparatus and methods for simultaneously depositing multiple-layer coatings on multiple substrates with essentially matched thicknesses and compositions for certain coating layers, while controllably varying, among the different substrates within a single batch, the thicknesses and/or compositions of one or more coating layers.

Further objects and advantages of the invention will become apparent from a consideration of the drawings and ensuing description.

DESCRIPTION AND OPERATION OF INVENTION

Figure 1:
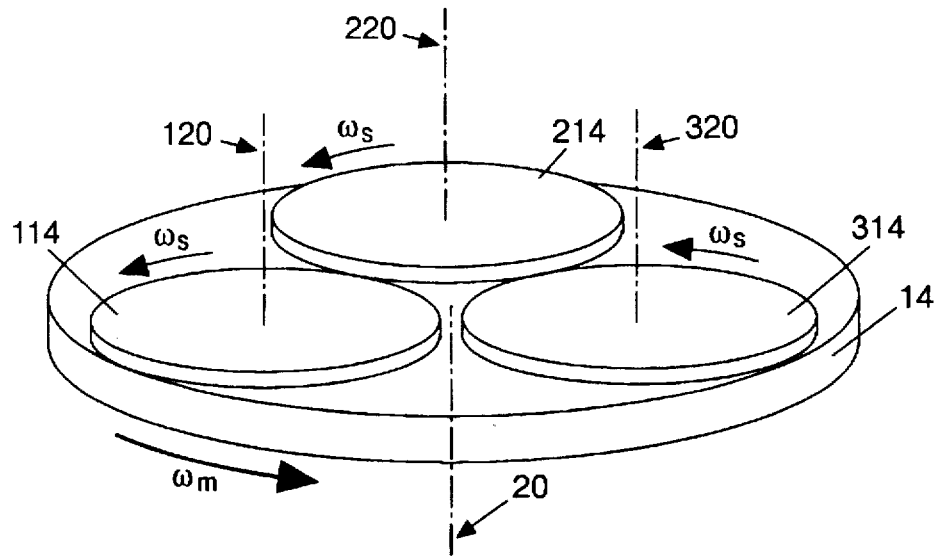
FIG. 1 is a prior-art perspective view of planetary susceptor rotation.
Figure 2:
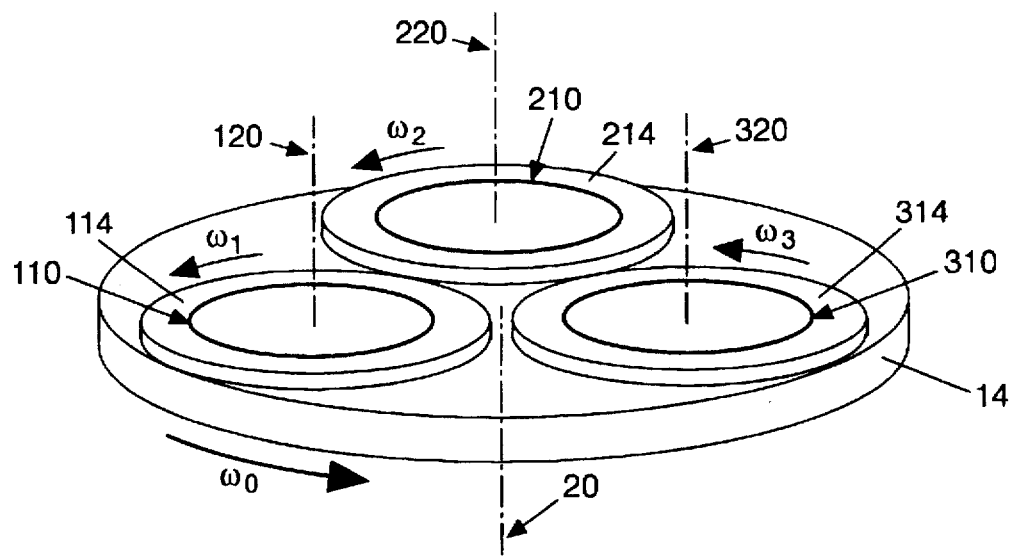
FIG. 2 is a perspective view of one embodiment of the planetary susceptor rotation according to the invention.

FIG. 2 illustrates one embodiment of the planetary form of susceptor rotation according to the invention, where a main susceptor 14 rotates at a rotation rate of $\omega_0$ in the indicated direction about main axis 20 and includes a number of secondary susceptors 114, 214, and 314 (for example, three secondary susceptors). A number of wafer substrates 110, 210, and 310 to be coated are placed on secondary susceptors 114, 214, and 314 respectively. Secondary susceptors 114, 214, and 314 rotate at rotation rates $\omega_1$, $\omega_2$, and $\omega_3$ in the indicated direction about secondary axes 120, 220, and 320 respectively. Depending on whether the actual rotation is against or along the indicated direction, the rotation rates $\omega_0$, $\omega_1$, $\omega_2$, or $\omega_3$ could be either negative or positive (or zero for no rotation). The rotation rates $\omega_1$, $\omega_2$, and $\omega_3$ are measured in reference to main susceptor 14. As a minimum, at least two significantly different rotation rates (the differences should be at least 1%, preferably >>1%) should be simultaneously available among secondary susceptors 114, 214, and 314. Preferably, each rotation rate $\omega_0$, $\omega_1$, $\omega_2$, and $\omega_3$ varies independently. A preferred planetary susceptor rotation device is that disclosed in U.S. Pat. No. 5,468,299 by Tsai, which satisfies all of the requirements and preferences set forth above.

Figure 3:
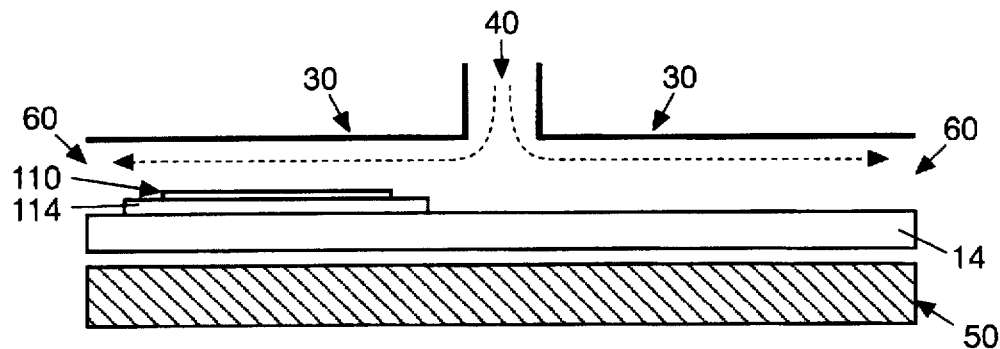
FIG. 3 is a schematic illustration of a preferred embodiment of the CVD apparatus according to the invention.

A preferred embodiment of the CVD apparatus according to the invention is illustrated in FIG. 3, which shows a simplified cross-sectional view of a horizontal radial-flow reactor, such as that disclosed in U.S. Pat. No. 4,961,399 by Frijlink, incorporating the planetary susceptor rotation shown in FIG. 2. The reactor includes a wall 30, a central gas inlet 40, a heater 50 for the susceptors and substrates, and a circumferential gas outlet 60. The gases flow from inlet 40 over the substrates to outlet 60 as indicated by the dashed arrows. Heated by the substrates and the susceptors, the gases pyrolyze and deposit material on the substrates. It is clear from this example that the planetary susceptor rotation shown in FIG. 2 can be readily adopted to other configurations of reactors, including vertical-flow reactors, barrel reactors, horizontal-flow reactors, and many other types of reactors referenced earlier in the background section.

The CVD apparatus incorporating the planetary susceptor rotation shown in FIG. 2 significantly improves the CVD process. As it is commonly known for CVD processes, the thickness of the gas boundary layer over the substrate determines the diffusion rate of the source material onto the substrate, which determines the rate of deposition (see pages 321–329 in *Semiconductor Devices, Physics and Technology* by S. M. Sze, 1985). In addition, or multiple-component coating containing several elements, the thickness of the gas boundary layer also determines the composition of the coating, since each element has different diffusivity. Different rotation rates $\omega_1$, $\omega_2$, or $\omega_3$ will result in different thicknesses of the gas boundary layer over substrates 110, 210, or 310. As a result, the rate of deposition (and composition for multiple-component coating) on each substrate 110, 210, or 310, will vary with the rotation rate $\omega_1$, $\omega_2$, or $\omega_3$ of each secondary susceptor 114, 214, or 314 respectively.

The two or more different rotation rates available among secondary susceptors 114, 214, and 314 would allow, in a single batch during process development, multiple iterations of a specific CVD process to achieve the proper layer thicknesses and/or compositions by testing at the same time several different rotation rates. The rotation rate $\omega_p$ that results in the proper layer thicknesses and/or compositions would be applied to the final production process, where the individual rotation rates $\omega_1$, $\omega_2$, and $\omega_3$ would all be set to $\omega_p$. The invention minimizes the number of separate batches necessary during process development. As a result, the invention reduces significantly the time for process development and the consumption of source materials.

The two or more different rotation rates available among secondary susceptors 114, 214, and 314 would also allow the simultaneous deposition of multiple-layer coatings on multiple substrates with essentially matched thicknesses and compositions for certain coating layers, while controllably varying, among the different substrates within a single batch, the thicknesses and/or compositions of one or more coating layers. This can be accomplished quite easily by applying the invention. For the one or more steps in a CVD process where the controlled valiation among the different substrates within a single batch is required, the secondary susceptors 114, 214, and 314 would rotate at two or more different rates. The different rotation rates would result in the variation of layer thicknesses and/or layer compositions among the substrates within a single batch. The layer thickness and composition would remain uniform within each substrate as a result of the planetary susceptor rotation. For the other steps in the CVD process, the secondary susceptors 114, 214, and 314 would rotate at the same rate, resulting in essentially matched thicknesses and compositions for the layers deposited during these particular steps.

This application of the invention can be applied to the fabrication of many different devices. One example would be semiconductor quantum-well lasers grown by metal-organic CVD, see *Long-Wavelength Semiconductor Lasers* by G. P. Agrawal and N. K. Dutta, 1986. It is often necessary to fabricate quantum-well lasers possessing well-matched electrical and spatial-mode characteristics. At the same time, a plurality of different lasing wavelengths is also necessary. This can be accomplished quite easily with the invention by rotating the secondary susceptors 114, 214, and 314 at different rates to vary, among the different substrates within a single batch, the thicknesses of the quantum-well layer. The thickness variation of the quantum-well layer will result in a plurality of different lasing wavelengths from the fabricated lasers. The secondary susceptors 114, 214, and 314 would rotate at the same rate for the other layers within the laser structure, such as the waveguiding layers or the electrical contact layers, thereby ensuring matched electrical and spatial-mode characteristics from the fabricated lasers.

For semiconductor lasers incorporating distributed feedback (DFB), the layers surrounding the periodic grating structure can be varied to produce lasers with different output wavelengths.

Figure 4:
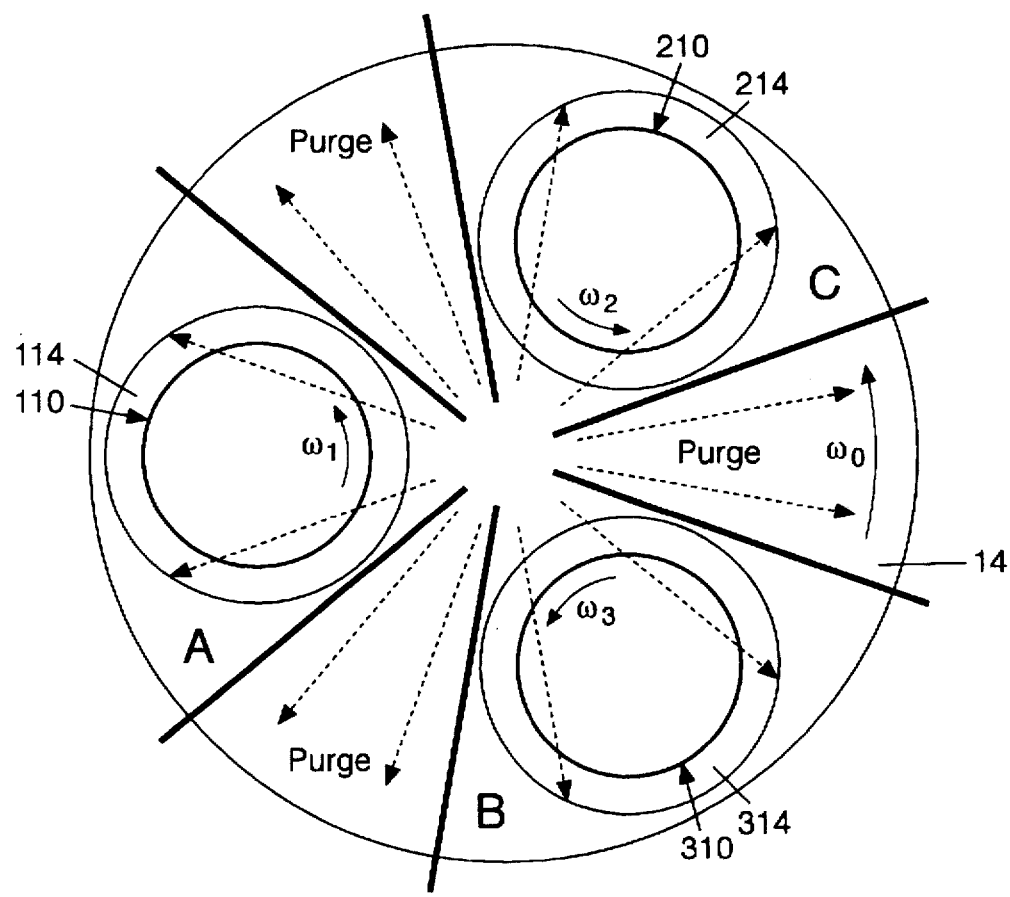
FIG. 4 is a schematic illustration of a multiple-zone embodiment of the CVD apparatus according to the invention.

The invention is not limited to a CVD reactor with a single deposition zone. The invention is equally applicable to CVD reactors with multiple deposition zones such as that disclosed in U.S. Pat. No. 4,976,996 by Monkowski and U.S. Pat. No. 4,058,430 by Suntola. The planetary susceptor rotation shown in FIG. 2 would allow individual control of coating layer thickness and/or composition over each substrate within each deposition zone. FIG. 4 illustrates a possible configuration of a multiple-zone apparatus according to the invention. There are a total of three zones labeled A, B, and C along with zones in between for purge gas. The planetary susceptor rotation is similar to that shown in FIG. 2. The flow of the gases is indicated by the dashed arrows. It would be possible, for example, to deposit a thicker coating from zone A on substrate 110 by increasing its rotation rate in zone A, and at the same time deposit a thinner coating from zone A on substrate 210 by decreasing its rotation rate in zone A (For discussions here, only the magnitude of the rotation rate is being considered, not the actual direction of rotation). In the case of atomic layer epitaxy as disclosed in U.S. Pat. No. 4,058,430 by Suntola, the thickness of the coating would not vary significantly by the different rotation rates. Instead, the different rotation rates of the secondary susceptors would alter the overall layer composition by varying the atomic-layer surface-coverage within each deposition zone supplying one element (for example, more A than B could be in one atomic layer, and only C would be in the other atomic layer in the compound coating of $A_xB_{1-x}C$, where $0<x<1$).

SUMMARY, RAMIFICATION, AND SCOPE OF INVENTION

Accordingly, the CVD apparatus and methods of the invention have been described. Many disadvantages and constraints of the prior-art CVD apparatus and methods have been eliminated.

The invention allows, for production, the required coating uniformity over each substrate in a batch. During the process development for a specific coating, the invention also minimizes the development time and the consumption of source materials. The invention allows, in a single batch, multiple iterations of process corrections required to achieve the proper layer thicknesses and/or compositions for a specific coating process.

The invention provides versatile CVD apparatus and methods for simultaneously depositing multiple-layer coatings on multiple substrates with essentially matched thicknesses and compositions for certain coating layers, while controllably varying, among the different substrates within a single batch, the thicknesses and/or compositions of one or more coating layers.

The invention allows the deposition of significantly different coating layers among substrates in a batch within a CVD apparatus containing only substantially uniform vapor ambient.

While my above description contains many specificities, these should not be construed as limitations on the scope of the invention, but rather as an exemplification of preferred embodiments thereof. Many other variations are possible. For example, the main susceptor could be eliminated completely, leaving only a rotatable support structure for the rotatable secondary susceptors. Instead of a circular disk as shown, the main susceptor could be shaped as a polygonal frustum for use in a barrel reactor. The main susceptor could be made with an aperture at the center for a gas inlet or outlet. Instead of being equally distant from the center of the main susceptor, the centers of the secondary susceptors could be located at different distances from the center of the main susceptor.

Accordingly, the scope of the invention should be determined not by the embodiments illustrated, but by the appended claims and their legal equivalents.

I claim:

1. A chemical vapor deposition method for depositing at least one layer of material onto a plurality of substrates, comprising the steps of:

providing a reactor containing a planetary susceptor rotation means comprising a plurality of secondary susceptors for supporting said substrates, wherein said rotation means allows simultaneously at least two significantly different rotation rates for said secondary susceptors, and rotating said secondary susceptors simultaneously at said two or more rotation rates during at least a portion of depositing said layer, wherein at least one of said two or more significantly different rotation rates is not zero.

2. A method according to claim 1, wherein said diffreny rotation rates for said secondary susceptors result in different thicknesses and/or compositions associated with at least one of said layer deposited on said substrates.

3. A method according to claim 1, wherein one or more of said rotation rates of said secondary susceptors is changed during the deposition process.

4. A method according to claim 2, wherein one or more of said rotation rates of said secondary susceptors is changed during the deposition process.

5. A chemical vapor deposition method for depositing a plurality of layers of material onto a plurality of substrates, comprising the steps of:

providing a reactor containing a planetary susceptor rotation means comprising a plurality of secondary susceptors for supporting said substrates, wherein said rotation means allows simultaneously at least two independent rotation rates for said secondary susceptors, and rotating said secondary susceptors simultaneously at two or more significantly different rotation rates during at least a portion of depositing said layers, wherein at least one of said two or more significantly different rotation rates is not zero.

6. A method according to claim 5, wherein said different rotation rates for said secondary susceptors result in different thicknesses and/or compositions associated with at least one of said layers deposited on said substrates.

7. A method according to claim 5, including the further step of:

rotating said secondary susceptors simultaneously at same rotation rate during at least a portion of depositing said layers.

8. A method according to claim 6, including the further step of:

rotating said secondary susceptors simultaneously at same rotation rate during at least a portion of depositing said layers.

9. A method according to claim 5, wherein one or more of said rotation rates of said secondary susceptors is changed during the deposition process.

10. A method according to claim 6, wherein one or more of said rotation rates of said secondary susceptors is changed during the deposition process.

\* \* \* \* \*